(12) United States Patent
Chi

(10) Patent No.: US 7,999,576 B2
(45) Date of Patent: Aug. 16, 2011

(54) SENSE AMPLIFIER CONTROL CIRCUIT

(75) Inventor: Sung Soo Chi, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 12/694,442

(22) Filed: Jan. 27, 2010

(65) Prior Publication Data

US 2010/0127773 A1 May 27, 2010

Related U.S. Application Data

(62) Division of application No. 11/964,881, filed on Dec. 27, 2007, now Pat. No. 7,679,415.

(30) Foreign Application Priority Data

Oct. 11, 2007 (KR) .................. 10-2007-0102812

(51) Int. Cl.
*G01N 30/86* (2006.01)
(52) U.S. Cl. .......................... 327/1; 327/143
(58) Field of Classification Search ............... 327/1, 77, 327/143
See application file for complete search history.

(56) References Cited

U.S. PATENT DOCUMENTS 7,515,492 B2 * 4/2009 Seo .................. 365/205
7,679,415 B2 * 3/2010 Chi .................. 327/291
2007/0179756 A1 8/2007 Honda

FOREIGN PATENT DOCUMENTS

TW 530407 B1 5/2003
TW 200409136 A 6/2004
TW 200531068 A 9/2005

* cited by examiner

*Primary Examiner* — Hai L Nguyen
(74) *Attorney, Agent, or Firm* — Ladas & Parry LLP (57) ABSTRACT

The present invention discloses a sense amplifier control circuit which controls the sense amplifier. A sense amplifier control circuit comprises a voltage comparing unit outputting delay control signals having a value corresponding to each of divided voltages obtained by dividing a potential of a power supply voltage and a pull-up control signal generating unit outputting an overdrive control signal and a pull-up control signal by an active signal and changing an enable pulse width of the overdrive control signal in response to the delay control signals, whereby it is possible to reduce current consumption caused by unnecessary overdrive operation and prevent a potential drop of the power supply voltage and thus provide operational stability of the semiconductor memory device by providing the overdrive control signal of which the enable pulse width is controlled in response to the potential of the power supply voltage.

12 Claims, 10 Drawing Sheets

|  | HIGH VOLTAGE ←――――→ LOW VOLTAGE | | | | |
|---|---|---|---|---|---|
|  | 1 | 2 | 3 | 4 | 5 |
| Y0 | L | L | L | L | H |
| Y1 | L | L | L | H | H |
| Y2 | L | L | H | H | H |
| Y3 | L | H | H | H | H |
| OVDCB0 | H | L | H | H | H |
| OVDCB1 | H | H | L | H | H |
| OVDCB2 | H | H | H | L | H |
| OVDCB3 | H | H | H | H | L |

SENSE AMPLIFIER CONTROL CIRCUIT

CROSS-REFERENCE TO RELATED APPLICATIONS

The present application claims priority to Korean patent application number 10-2007-0102812 filed on Oct. 11, 2007, which is incorporated herein by reference in its entirety.

BACKGROUND OF THE INVENTION

The present invention relates generally to a semiconductor memory device, and more precisely to a sense amplifier control circuit controlling a sense amplifier.

Figure 1:
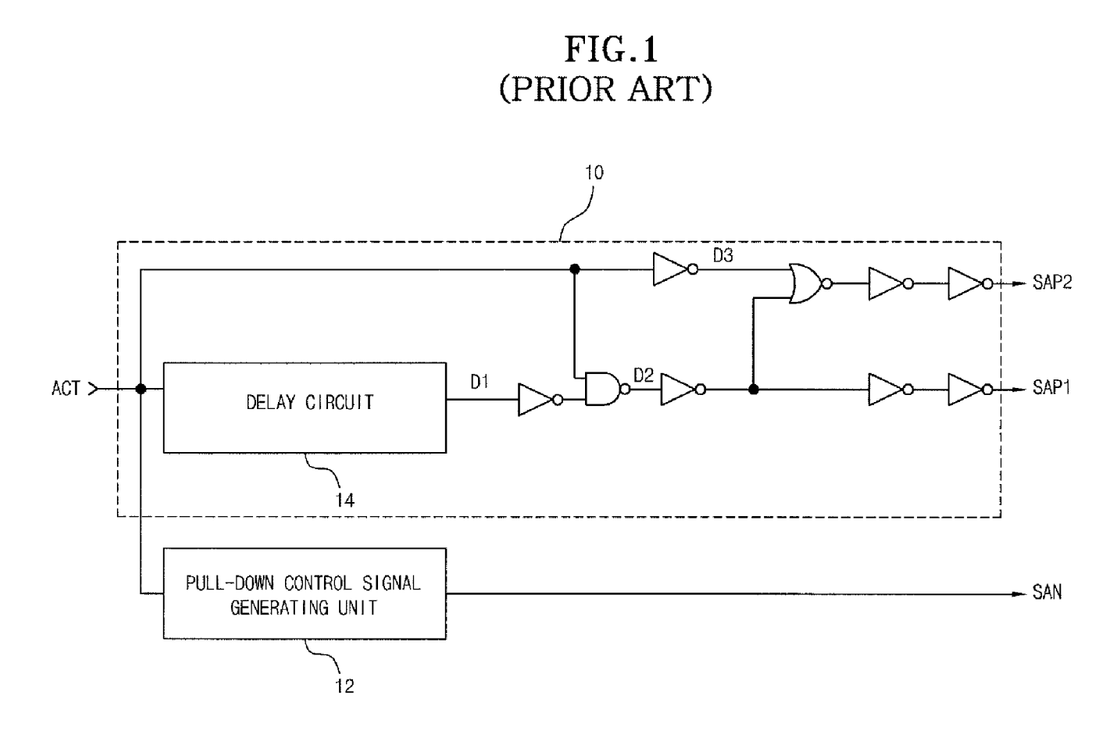
FIG. 1 is a block diagram showing a sense amplifier control circuit according to a related art.

In general, a semiconductor memory device includes the sense amplifier, which senses and amplifies the charge sharing in bit line of the semiconductor memory device by an active signal. In order to improve the amplifying speed of the sense amplifier, the memory device can use an overdriving method that drives the sense amplifier with an overdrive voltage, e.g., a boost voltage VPP, higher than a core voltage VCORE which is a cell capacitance potential at the beginning of amplification. Referring to FIG. 1, the sense amplifier control circuit comprises a pull-up control signal generating unit 10, which receives an active signal ACT and generates an overdrive control signal SAP1 and a pull-up control signal SAP2, and a pull-down control signal generating unit 12, which receives the active signal ACT and generates a pull-down control signal SAN.

Herein, the pull-up control signal generating unit 10 combines the active signal ACT with a delay signal D1 obtained by delaying the active signal ACT to generate the overdrive control signal SAP1 and the pull-up control signal SAP2 which are sequentially enabled. That is, the pull-up control signal SAP2 is enabled at a time point when the overdrive control signal SAP1 is disabled.

Figure 2:
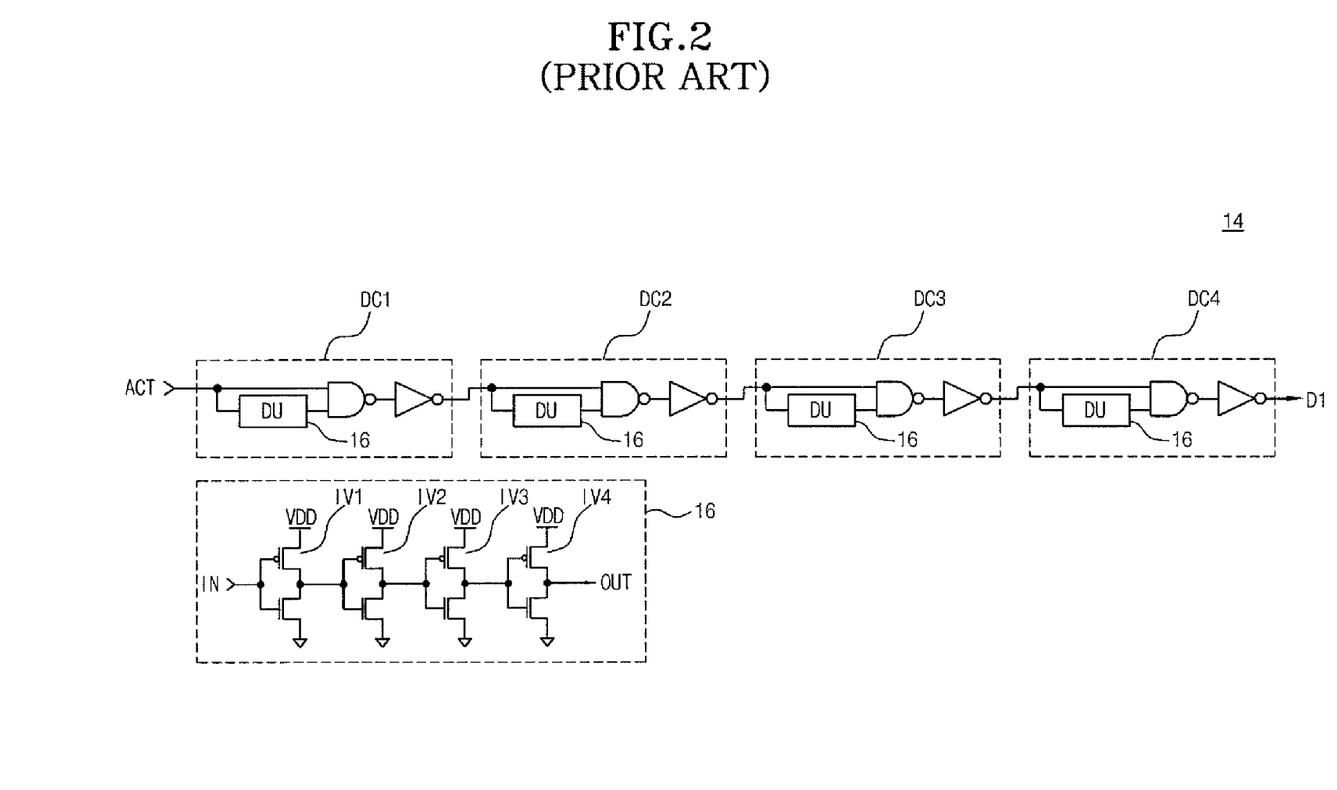
FIG. 2 is a detailed circuit diagram showing a delay circuit of FIG. 1.

Referring to FIG. 2, the delay circuit 14 includes a plurality of delay chains DC1 to DC4 which are connected in series.

Each of delay chains DC1 to DC4 delays the input signal by a prescribed time tD and outputs it. Subsequently, if the delay chains DC1 to DC4 are connected in series, the output signal is a signal which delays the input signal for a time t4D obtained by multiplying the time tD delayed via each delay chain DC1 to DC4 by the number of the delay chains (herein, 4).

That is, the delay circuit 14 outputs the delay signal DC1 obtained by delaying the active signal ACT by the prescribed time 4tD, via each delay chain DC1 to DC4.

Meanwhile, the delay time tD delayed by each delay chain DC1 to DC4 depends on a potential of the power supply voltage VDD. This is because the delay cell 16 (DU: Delay Unit) included in each delay chain DC1 to DC4 is influenced by the potential of the power supply voltage VDD.

As shown in FIG. 2, the delay cell 16 can be composed of a plurality of inverters IV1 to IV4 connected in series, in which the inverters IV1 to IV4 are characterized in having an operation velocity varied in accordance with the potential of the power supply voltage VDD. In other words, the delay time tD of the input signal IN depends on the potential of the power supply voltage VDD.

That is, if the potential of the power supply voltage VDD increased, the operation velocity of each inverter IV1 to IV4 also increases, and consequently the delay time of the input signal IN is reduced. On the other hand, if the potential of the power supply voltage VDD is decreased, the operation velocity of each of the inverters IV1 to IV4 is also decreased, and therefore the delay time of the input signal IN is increased.

The operation of the sense amplifier control circuit shown in FIG. 1 will be explained in reference to FIG. 3. If the active signal ACT is enabled, the pull-up control signal generating unit 10 receives the active signal ACT, which is delayed by the prescribed time D by the delay circuit and the delay circuit 14 ouputs the delay signal D1. The pull-up control signal generating unit 10 NAND-combines the active signal ACT with a signal obtained by inverting the delay signal D1 to generate a signal D2. The pull-up control signal generating unit 10 generates an overdrive control signal SAP1 by inverting the signal D2. Further, the pull-up control signal generating unit 10 generates the pull-up control signal SAP2 by NOR-combining the inverted active signal D3 with the overdrive control signal SAP1. The pull-up control signal SAP2 is enabled at a time point when the overdrive control signal SAP1 is disabled.

The pull-down control signal generating unit 12 generates the pull-down control signal SAN which is enabled in synchronization with an enable time point of the overdrive control signal SAP1 and the pull-down control signal SAN is disabled in synchronization with a disable time point of the pull-up control signal SAP2, if the active signal ACT is enabled.

An enable pulse width PW1 of the overdrive control signal SAP1 is determined by the delay time D of the delay signal D1 delayed by the delay circuit 14 as illustrated in FIG. 1.

Figure 3:
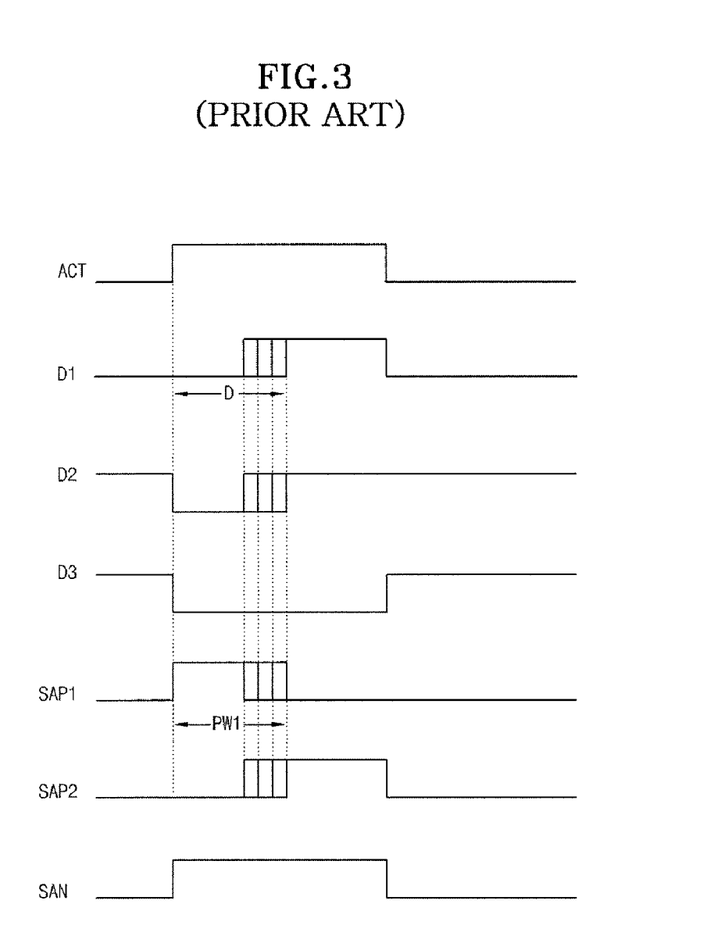
FIG. 3 is a waveform diagram showing a control signal output from the sense amplifier control circuit of FIG. 1.
Figure 4:
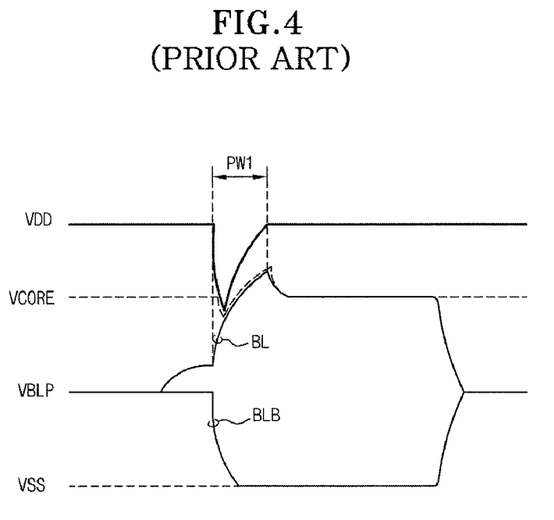
FIG. 4 is an operational waveform diagram showing a sense amplifier operated by the control signal of FIG. 3.

Referring to FIG. 4, when the sense amplifier control signals SAP1, SAP2, and SAN are given as shown in FIG. 3, an operation of the sense amplifier will be described.

When the cell transistor permits charge sharing with bit lines by driving word lines selected by the active signal, the sense amplifier amplifies a potential of the bit line (for example, BL) rapidly up to a level of the core voltage VCORE if the overdrive voltage VPP is applied by the overdrive control signal SAP1.

And then, the sense amplifier remains the potential of the bit line BL at the level of the core voltage VCORE if the core voltage VCORE is applied by the pull-up control signal SAP2 enabled sequentially after the overdrive control signal SAP1 is disabled.

Further, if a ground voltage VSS is applied by the pull-down control signal SAN, the sense amplifier amplifies the potential of the bit line (for example, BLB) to the level of the ground voltage VSS.

As such, the sense amplifier performs the overdrive operation during a section PW1 when the overdrive control signal SAP1 is enabled, in which the enable pulse section PW1 of the overdrive control signal SAP1 may be designed in response to the operation voltage. That is, the semiconductor memory device may be designed with the enable pulse width PW1 of the overdrive control signal SAP1 corresponding to a case that the operational voltage is, for example, 1.8V.

The potential of the power supply voltage VDD can be varied from 2.1V to 1.5V, but the enable pulse width PW1 of the overdrive control signal SAP1 must be controlled in response to changes of the power supply voltage VDD. The sense amplifier control circuit according to prior art cannot randomly control the enable pulse width PW1 of the overdrive control signal SAP1 in response to changes of the power supply voltage VDD.

As a result, if the power supply voltage VDD is increased, the potential of the bit line BL is unnecessarily above the level of the core voltage VCORE during performance of the overdrive operation, which results in increasing current consumption.

Further, if the power supply voltage VDD is lowered, the potential of the power supply voltage VDD is unnecessarily below the level of the core voltage VCORE during performance of the overdrive operation, as a result it is difficult to perform the normal operation.

SUMMARY OF THE INVENTION

The present invention provides a sense amplifier control circuit providing an overdrive control signal of which an enable pulse width is controlled in response to a potential of a power supply voltage, whereby it is possible to reduce current consumption by performing an overdrive operation by the overdrive control signal and improve an operational stability of a semiconductor memory device by preventing a potential drop of the power supply voltage.

A sense amplifier control circuit according to one aspect of the present invention comprises a voltage comparing unit receiving a power supply voltage and outputting delay control signals having values corresponding to each of a plurality of divided voltages obtained by dividing a potential of the power supply voltage; and a pull-up control signal generating unit receiving an active signal and outputting an overdrive control signal and a pull-up control signal according to the active signal, wherein the pull-up control signal generating unit changes an enable pulse width of the overdrive control signal in response to the delay control signals.

Preferably, the voltage comparing unit comprises a voltage dividing unit dividing the potential of the power supply voltage outputting the plurality of divided voltages having sequential voltage levels; a comparing unit comparing each of the divided voltages with a reference voltage and outputting comparing signals; a delay control signal combining the comparing signals corresponding to the divided voltages having sequential adjacent potential levels to generating unit generating the delay control signals; and an output control unit controlling outputs of the delay control signals according to an enable signal.

More preferably, the voltage dividing unit comprises a first resistor connected the power supply voltage; and a plurality of second resistors connected in series between the first resistor a ground voltage, wherein the divided voltages are sequentially output from each of a plurality of common nodes between the second resistors.

More preferably, the first resistor has a value larger than that of each of the plurality of second resistors, and each of the plurality of second resistors has the same value.

Further, the comparing unit receives the divided voltage and supplies the divided voltage to an inverted terminal thereof, and the comparing unit receives the reference voltage and supplies the reference voltage to a non-inverted terminal thereof, and the comparing unit outputs the comparing signal by comparing the potentials of the divided voltage and the reference voltage.

Further, the delay control signal generating unit combines the outputted comparing signal, with the inverted comparing signal obtained by inverting the comparing signal output output that immediately precedes the outputted comparing signal, and the inverted comparing signal obtained by inverting the comparing signal output that immediately follows the outputted comparing signal, and the delay control signal generating unit enables and outputs the delay control signal when the inverted comparing signals are all enabled.

Further, the pull-up control signal generating unit comprises a delay unit delaying and outputting the active signal according to the delay control signals; and a control signal generating unit combining an output from the delay unit to generate the overdrive control signal and the pull-up control signal.

Preferably, the delay unit comprises a path selecting unit generating a path select signal according to the delay control signals and selecting an output path of the active signal according to the path select signal; and a delay control unit selected according to the path select signal to delay the active signal and controlling a delay time of the active signal according to the delay control signals to deliver it to an output of the delay unit.

Preferably, the path selecting unit comprises a NAND gate receiving the delay control signals and enabling and outputting the path select signal if any one of the delay control signals is enabled; a first path gate delivering the active signal to an output of the delay unit when the path select signal is disabled; and a second path gate delivering the active signal to the delay control unit when the path select signal is enabled.

Preferably, the delay control unit comprises a plurality of delay chains connected in series to delay the output of the path select unit sequentially; and path gates connected in parallel with each of the plurality of delay chains to control an output of each delay chain according to the corresponding delay control signal.

More preferably, each delay chain comprises a delay cell delaying an input signal by a prescribed time and outputting the input signal; a NAND gate inputting the input signal and an output from the delay cell; and an inverter inverting an output from the NAND gate and outputting the inverted output from the NAND gate.

More preferably, the delay cell comprises a plurality of inverters connected in series.

A sense amplifier control circuit according to second aspect of the present invention comprises a delay control signal generating unit receiving a power supply voltage and outputting delay control signals having values corresponding to each of a plurality of divided voltages obtained by dividing a potential of a power supply voltage; a path select unit selecting a delay path of an active signal according to the delay control signals; a delay control unit selected by the path select unit to control a delay of the active signal according to the delay control signals and outputs the active signal; and a control signal generating unit receiving the active signal an output from the path select unit or an output from the delay control unit as a delay signal to generate an overdrive control signal and a pull-up control signal used for driving the sense amplifier.

Preferably, the delay control signal generating unit comprises a voltage dividing unit outputting the plurality of the divided voltages having sequential voltage levels by dividing the potential of the power supply voltage; a voltage comparing unit comparing each of the divided voltages with a reference voltage and outputting comparing signals; an output signal generating unit combining the comparing signals generated by the divided voltages having sequential adjacent potential levels and outputting the delay control signals; and an output control unit controlling outputs of the delay control signals according to an enabled signal applied from a mode register set.

More preferably, the voltage dividing unit comprises a first resistor connected to the power supply voltage; and a plurality of second resistors connected in series between the first resistor and a ground voltage, wherein the divided voltages are sequentially output from each of the common nodes between the second resistors.

More preferably, the first resistor has a value larger than that of each of the plurality of second resistors and each of the plurality of second resistors has the same value.

More preferably, the voltage comparing unit comprises a plurality of comparators comparing each divided voltage with the reference voltage and outputting the comparing signals.

More preferably, the output signal generating unit combines the outputted comparing signal, with the inverted comparing signal obtained by inverting the comparing signal output that immediately precedes the outputted comparing signal, and the inverted comparing signal obtained by inverting the comparing signal output that immediately follows the outputted comparing signal, and the output signal generating unit enables and outputs the delay control signal when the comparing signal and the inverted comparing signals are all enabled.

Further, the path selecting unit comprises a NAND gate receiving the delay control signals and outputting the path select signal if any of the delay control signals is enabled; a first path gate outputting the active signal as the delay signal when the path select signal is disabled; and a second path gate outputting the active signal to the delay control unit when the path select signal is enabled.

Further, the delay control unit comprises a plurality of delay chains connected in series to sequentially delay the active signal delivered from the path selecting unit; and path gates connected in parallel with an output terminal of each of the delay chains and controlled by the delay control signals to output the delay signal from each delay chain.

Preferably, the each delay chain comprises a delay cell delaying an input signal by a prescribed time and outputting the input signal; a NAND gate inputting the input signal and an output from the delay cell; and an inverter inverting an output from the NAND gate and outputting it.

More preferably, the delay cell comprises a plurality of inverters connected in series.

Further, the control signal generating unit comprises a first inverter inverting the delay signal; a NAND gate NAND-combining an output from the first inverter with the active signal; a second inverter inverting the active signal; a third inverter inverting an output from the NAND gate; a NOR gate inputting outputs from the second inverter and the third inverter; a first inverter group outputting the output from the second inverter as the overdrive control signal; and a second inverter group outputting the output from the NOR gate as the pull-up control signal.

Preferably, the first inverter group and the second inverter group each comprise an even number of inverters connected in series.

The present invention can reduce current consumption caused by the overdrive operation at high power supply voltage and prevent a potential drop of the power supply voltage caused by the overdrive operation at low power supply voltage and thus improve operational stability of the semiconductor memory device, by providing the sense amplifier control circuit controlling the enable pulse width of the overdrive control signal in response to the potential of the power supply voltage.

DESCRIPTION OF SPECIFIC EMBODIMENTS

Hereinafter, preferred embodiments of the present invention will be described in detail with reference to the accompanying drawings.

The present invention provides a sense amplifier control circuit providing overdrive control signal of which an enable pulse width is controlled in response to a potential of the power supply voltage.

Figure 5:
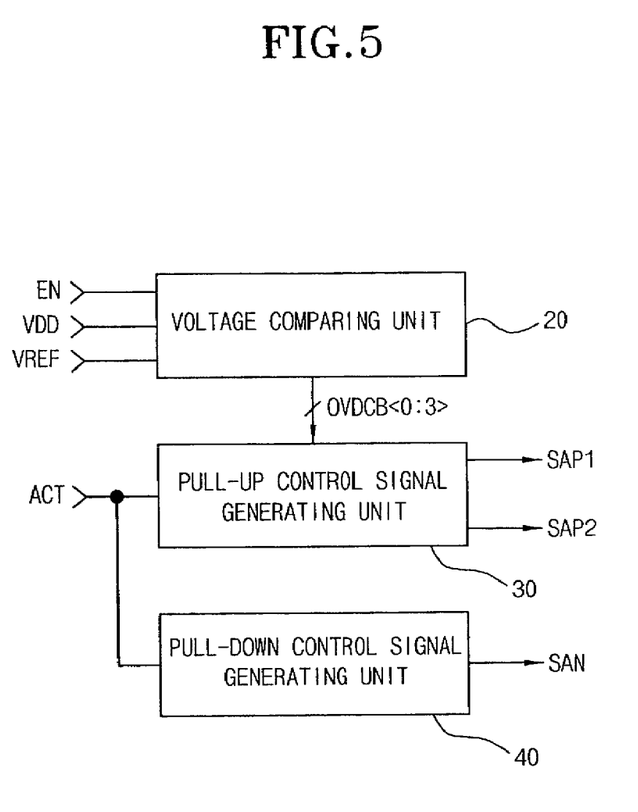
FIG. 5 is a block diagram showing the sense amplifier control circuit according to one embodiment of the present invention.

Referring to FIG. 5, the sense amplifier control circuit according to a first embodiment of the present invention comprises a voltage comparing unit 20, a pull-up control signal generating unit 30, and a pull-down control generating unit 40.

The voltage comparing unit 20 outputs delay control signals OVDCB<0:3> by comparing a divided voltage VD0 to VD3, obtained by dividing a power supply voltage VDD, with a reference voltage VREF when an enable signal EN is enabled.

The pull-up control signal generating unit 30 outputs an overdrive control signal SAP1 and a pull-up control signal SAP2 of which an enable pulse width is controlled by a active signal ACT and the delay control signals OVDCB<0:3>.

The pull-down control signal generating unit 40 outputs a pull-down control signal SAN which is enabled in synchronization with the overdrive control signal SAP1 in response to the active signal ACT.

Figure 6:
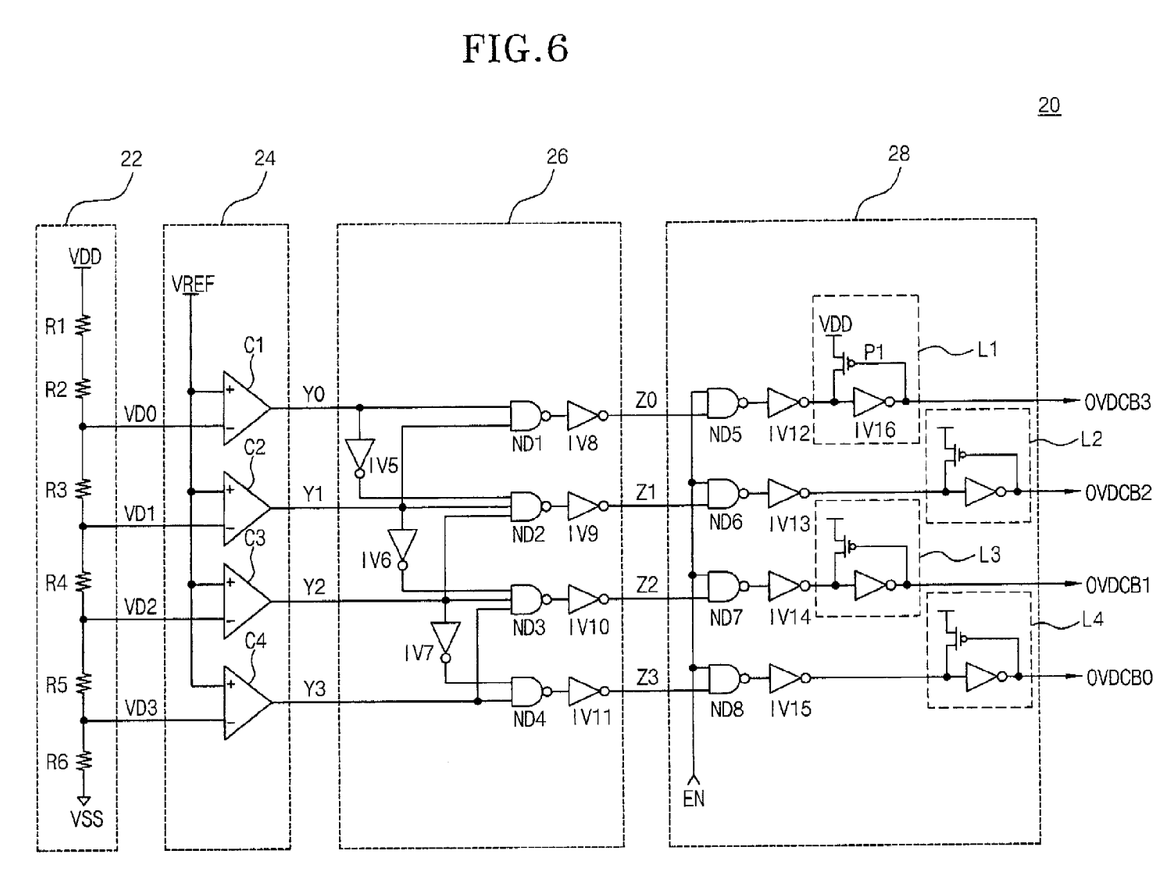
FIG. 6 is a detailed circuit diagram showing a voltage comparing unit of FIG. 5.

Referring to FIG. 6, the voltage comparing unit 20 comprises a voltage dividing unit 22 that outputs a plurality of divided voltages VD0 to VD3 by dividing the power supply voltage VDD by utilizing a plurality of resistors in series, a comparing unit 24 that compares each divided voltage VD0 to VD3 with a reference voltage VREF and the output comparing signals Y<0:3>, a delay control signal generating unit 26 that combines the comparing signals Y<0:3> to output the delay control signals Z<0:3>, and an output control unit 28 that outputs the delay control signals Z<0:3> as delay control signals OVDCB<0:3> according to the state of an enable signal EN.

The voltage dividing unit 22 includes resistors R1 to R6 connected in series between the power supply voltage VDD and a ground voltage VSS. The divided voltages VD0 to VD4 are output from each common node between the resistors <R2, R3>, <R3, R4>, <R4, R5> and <R5, R6>, No voltage is output from the common node between the resistors R1, R2.

Herein, the resistor R1 is used as a load and can therefore have a high resistance value as compared with the remaining resistors R2 to R6. It is preferable that each resistor R2 to R6 have identical resistance. Therefore, the potential of each divided voltage VD0 to VD3 can be realized so that VD0>VD1>VD2>VD3.

The comparing unit 24 includes comparators C1 to C4. Each of the divided voltages VD0 to VD3 compared to the reference voltage VREF with each of the divided voltages supplied to an inversion terminal (−) and the reference voltage VREF supplied to a non-inversion terminal (+) in each of the comparators C1 to C4. Thus the comparing signal Y<0:3> outputs a low level for each potential of the divided voltages VD0 to VD3 that is higher than that of the reference voltage VREF.

More specifically, the comparing unit C1 compares the divided voltage VD0 with the reference voltage VREF and outputs the comparing signal Y0 of low level if the potential of the divided voltage VD0 is higher than that of the reference voltage VREF. Similarly, the structure and operation of the comparators C2 to C4 are the same as those of the comparator C1.

The delay control signal generating unit 26 includes NAND gates ND1 to ND4 and inverters IV5 to IV11, and outputs the delay time control signals Z<0:3> by combining the comparing signals Y<0:3>.

More specifically, the NAND gate ND4 inputs the comparing signal Y3 and the comparing signal Y2 inverted by the inverter IV7, the NAND gate ND3 inputs the comparing signals Y<2:3> and the comparing signal Y1 inverted by the inverter IV6, the NAND gate ND2 inputs the comparing signals Y<1:2> and the comparing signal Y0 inverted by the inverter IV5, and the NAND gate ND1 inputs the comparing signals Y<0:1>. And, each of the inverters IV8 to IV11 inverts an output from each of the NAND gates ND1 to ND4 to output it as the delay time control signals Z<0:3>.

The output control unit 28 comprises NAND gates ND5 to ND8, inverters IV12 to IV15 and latches L1 to L4, and outputs the signals Z<0:3> as the delay control signals OVDCB<0:3> according to the enable signal EN. Herein, the enable signal EN is applied from a mode register set (not shown) as an enable control signal of the sense amplifier control circuit.

More specifically, each of the NAND gates ND5 to ND8 inputs each signal Z<0:3> and the enable signal EN, each of the inverters IV12 to IV15 inverts an output from each NAND gate ND5 to ND8, and each of the latches L1 to L4 latches and inverts the output from each inverter IV12 to IV15 to output it as the delay control signals OVDCB<0:3>.

Figure 7:
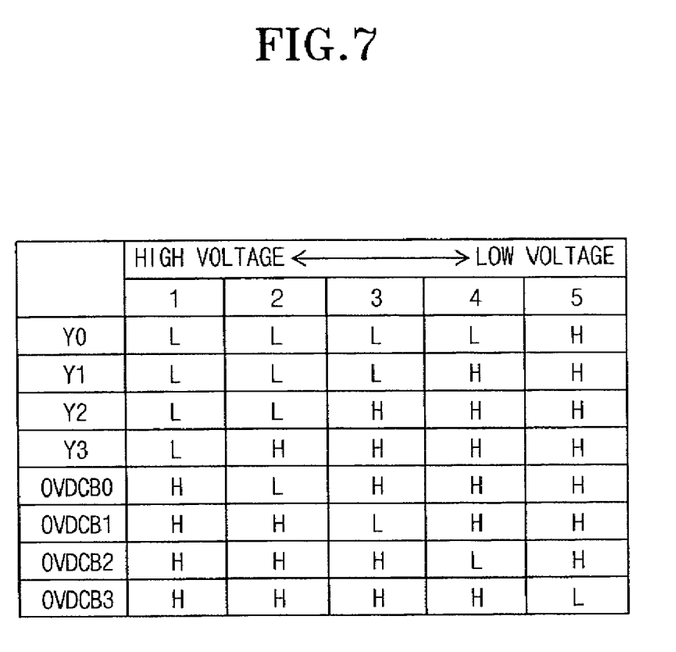
FIG. 7 is a truth table showing a comparing signal and a delay control signal output from the voltage comparing unit in response to a potential of the power supply voltage.

Herein, the latch L1 comprises an inverter IV16 that inverts an output from the inverter IV12, and a PMOS transistor P1 controlled by an output from the inverter IV16 applied to the gate of PMOS transistor P1 to apply the power supply voltage VDD to an input of the inverter IV16. Similarly, the structure and operation of other latches L2 to L4 are the same as those of the latch L1. FIG. 7 is a truth table showing the comparing signals Y<0:3> and the delay signals OVDCB<0:3> outputted in response to the potential of the power supply voltage VDD.

Herein, a column 1 indicates a case which the potential of the power supply voltage VDD is very high. Each column 2 through column 5 represents a lower potential of the power supply voltage VDD.

More specifically, column 1 indicates that the potential of the divided voltage VD3 is higher than that of the reference voltage VREF. Therefore, the comparing signals Y<0:3> are all output at a low level and the delay control signals OVDCB<0:3> are all output at a high level.

Column 2 indicates that the potential of the divided voltage VD2 is higher than that of the reference voltage VREF and the potential of the divided voltage VD3 is lower than that of the reference voltage VREF. In this case, the comparing signals Y<0:2> are output at a low level, the comparing signal Y3 is output at a high level, and only delay control signal OVDCB is output at a low level.

Column 3 indicates that the potential of the divided voltage VD1 is higher than that of the reference voltage VREF and the potential of the divided voltage VD2 is lower than that of the reference voltage VREF. In this case, the comparing signals Y<0:1> is output at a low level, the comparing signals Y<2:3> are output at a high level, and only delay control signal OVDCB1 is output at a low level.

Column 4 indicates that the potential of the divided voltage VD0 is higher than that of the reference voltage VREF and the potential of the divided voltage VD1 is lower than that of the reference voltage VREF. In this case, the comparing signal Y0 is output at a low level, the comparing signals Y<1:3> are output at a high level, and only delay control signal OVDCB2 is output at a low level.

Column 5 indicates that the potential of the divided voltage VD0 is lower than that of the reference voltage VREF. In this case, the comparing signals Y<0:3> are all output at a high level and only delay control signals OVDCB3 is output at a low level.

In other words, the voltage comparing unit 20 outputs the delay control signals OVDCB0 to OVDCB3 enabled-controlled in response to the potential of the power supply voltage VDD.

Figure 8:
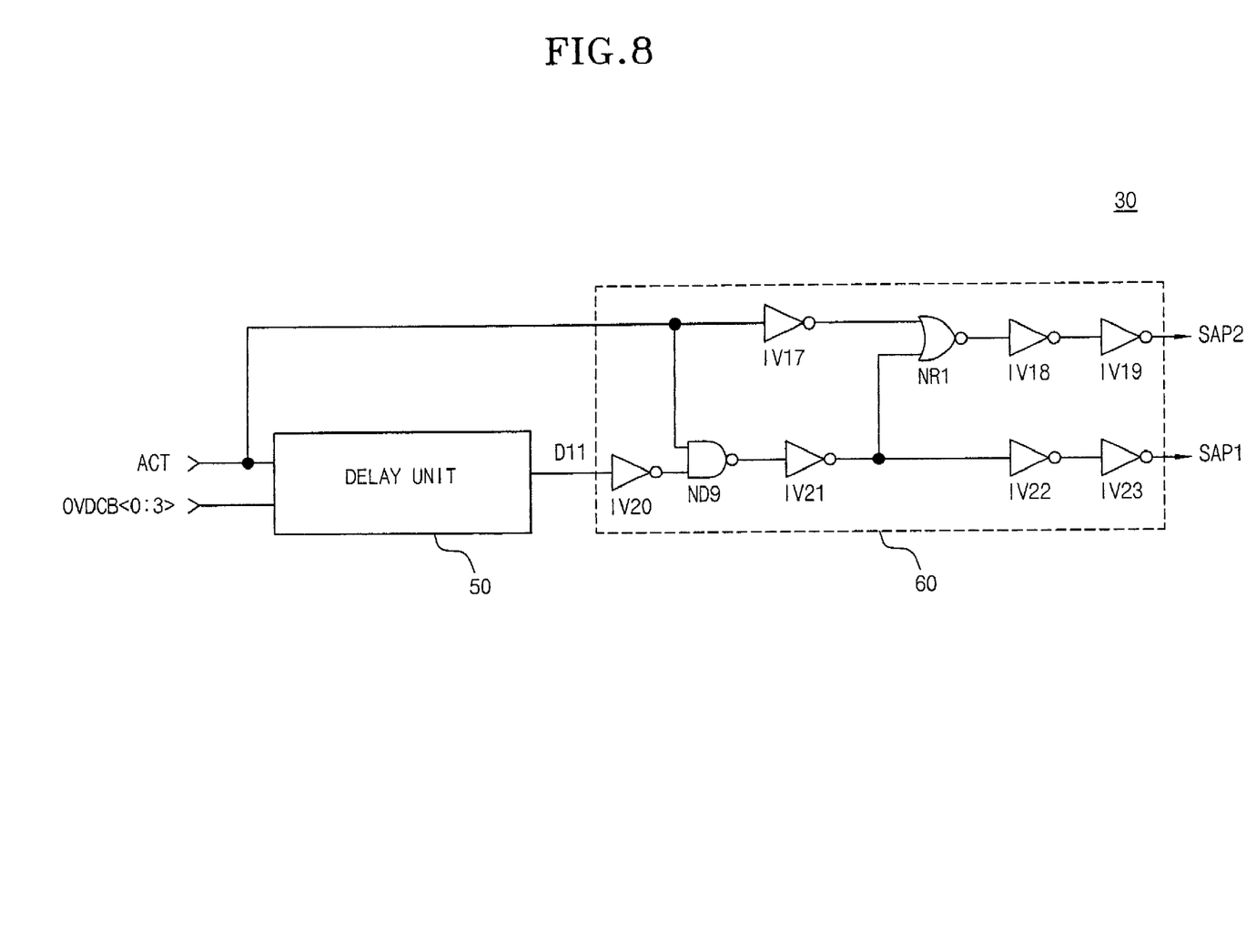
FIG. 8 is a block diagram showing a pull-up control signal generating unit of FIG. 5.

Referring to FIG. 8, the pull-up control signal generating unit 30 includes a delay unit 50 which controls a delay time of the active signal ACT by the delay control signals OVDCB<0:3> to output a delay signal D11 and a control signal generating unit 60 which logically combines the delay signal D11 with the active signal ACT to generate the overdrive control signal SAP1 and the pull-up control signal SAP2.

The control signal generating unit 60 comprises a NAND gate ND9, a NOR gate NR1 and inverters IV17 to IV23.

The NAND gate ND9 inputs a signal obtained by inverting the delay signal D11 by inverter IV20 the and inputs the active signal ACT. The NOR gate NR1 inputs a signal obtained by inverting an output from the NAND gate ND9 by the inverter IV21 and a signal obtained by inverting the active signal ACT by the inverter IV17. The inverters IV22, IV23 are driven by an output from the inverter IV21 to output the overdrive control signal SAP1, and the inverters IV18, IV19 are driven by an output from the NOR gate NR1 to output the pull-up control signal SAP2.

Herein, the enable pulse width of the overdrive control signal SAP1 is controlled by the delay time of the delay signal D11, which is controlled by the delay control signals OVDCB<0:3> output in response to the power supply voltage VDD.

Figure 9:
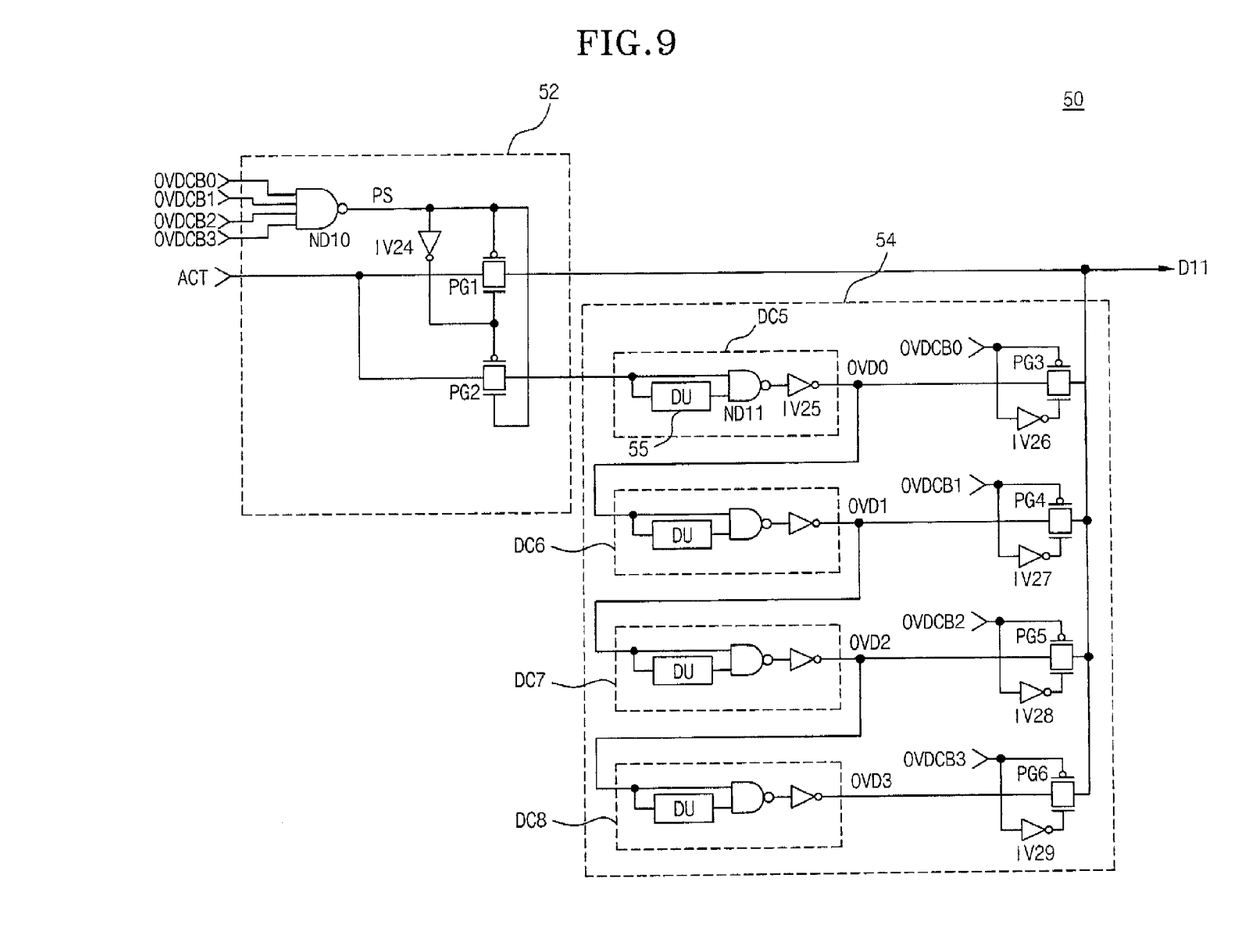
FIG. 9 is a detailed circuit diagram showing a delay unit of FIG. 8.

Referring to FIG. 9, the delay unit 50 comprises a path selecting unit 52 that sets an output path of the active signal ACT according to the delay control signals OVDCB<0:3> and a delay control unit 54 which controls the delay of the active signal ACT through the path selected according to the delay control signals OVDCB<0:3>.

The path selecting unit 52 comprises a NAND gate ND10, a path gates PG1 and PG2, and an inverter IV24.

The NAND gate ND10 receives the delay control signals OVDCB<0:3>, and disables and outputs the path select signal PS when the delay control signals OVDCB<0:3> are all in a high level.

The path gate PG1 outputs the active signal ACT as the delay signal D11 without delaying it when the path select signal PS is disabled, and the path gate PG2 delivers the active signal ACT to the delay control unit 54 when the path select signal PS is enabled. Herein, the inverter IV24 inverts the path select signal PS to apply it to the path gates PG1 and PG2.

The delay control unit 54 comprises a plurality of delay chains DC5 to DC8, which are connected in series, and a plurality of path gates PG3 to PG6, which are connected in parallel to an output terminal of each of the delay chains DC5 to DC8, in order to control an output from each delay chain DC5 to DC8 according to each delay control signal OVDCB<0:3>. The inverters IV26 to IV29 invert the delay control signals OVDCB<0:3>.

Herein, the delay chain DC5 comprises a delay cell 55, a NAND gate ND11, and an inverter IV25, and the delay chain DC5 delays an output from the path selecting unit 52 by a prescribed time tD in order to output the signal OVD0.

More specifically, the delay cell 55 delays the signal received from one of the path gates PG1 and PG2, the NAND gate ND11 receives the same signal from one of the path gates PG1 and PG2 and an output from the delay cell 55, and the inverter IV25 inverts the output from the NAND gate ND11 in order to output the signal OVD0. Herein, the delay cell 55 can be composed of a plurality of inverters, preferably an even number, connected in series to change the delay time TD of the input signal in response to the potential of the power supply voltage VDD.

Similarly, the structure and operation of other delay chains DC6 to DC8 are the same, and as such the output signals OVD1 to OVD3 are output by delaying the input signal sequentially.

Each of the path gates PG3 to PG6 is turn-on controlled by the delay control signals OVDCB<0:3> to output each output signal OVD0 to OVD3 of each delay chain DC5 to DC8 as the delay signal D11.

The operations of the delay unit 50 of FIG. 9 will be further explained in reference to the truth table of FIG. 7.

As shown in column 1, if the potential of the divided voltage VD3 is higher than that of the reference voltage VREF, the delay control signals OVDCB<0:3> are all output at a high level, as a result the path select signal PS is disabled. Therefore, the delay unit 50 outputs the active signal ACT as the delay signal D11. As a result, the overdrive control signal SAP1 remains in a disabled state, and thus the sense amplifier does not perform the overdrive operation.

That is, since the amplifying velocity can be secured even though not performing the overdrive operation if the potential of the power supply voltage VDD is very high, it is possible to prevent current consumption due to the overdrive operation.

In column 2 through column 5, at least one of the potentials of the divided voltages VD0 to VD3 is lower than the potential of the reference voltage VREF, therefore, as a result one of the delay control signals OVDCB0 to OVDCB3 is enabled at a low level and output to enable the path select signal PS. Therefore, the active signal ACT is output as the delay signal D11 by any one of the delay control signals OVDCB0 to OVDCB3 which are sequentially delayed and enabled by the delay control unit 54.

More specifically, the output signal OVD0, delayed by the delay chain DC5, is output as the delay signal D11 if the delay control signal OVDCB0 is enabled as in column 2, the output signal OVD1, delayed by the delay chains DC5 to DC6, is output as the delay signal D11 if the delay control signal OVDCB1 is enabled as in column 3, the output signal OVD2, delayed by the delay chains DC5 to DC7, is output as the delay signal D11 if the delay control signal OVDCB2 is enabled as in column 4, and the output signal OVD3, delayed by the delay chains DC5 to DC8, is output as the delay signal D11 if the delay control signal OVDCB3 is enabled as in column 5.

As such, it is possible to control the delay time of the delay signal D11 by controlling the number of delay chains by which the active signal ACT is delayed in response to the potential of the power supply voltage VDD. That is, according to the present invention it is possible to reduce current consumption by preventing excessive overdrive operation. According to the present invention it is also possible to secure operational stability of the semiconductor memory device by improving a potential drop of the power supply voltage VDD caused by the overdrive operation, which can be accomplished by controlling the enable pulse width of the overdrive control signal SAP1 in response to the potential of the power supply voltage VDD, Referring to FIG. 10, the sense amplifier control circuit according to a second embodiment of the present invention comprises a delay control signal generating unit 70, a path selecting unit 72, a delay control unit 74, a control signal generating unit 76, and a pull-down control signal generating unit 78.

Figure 10:
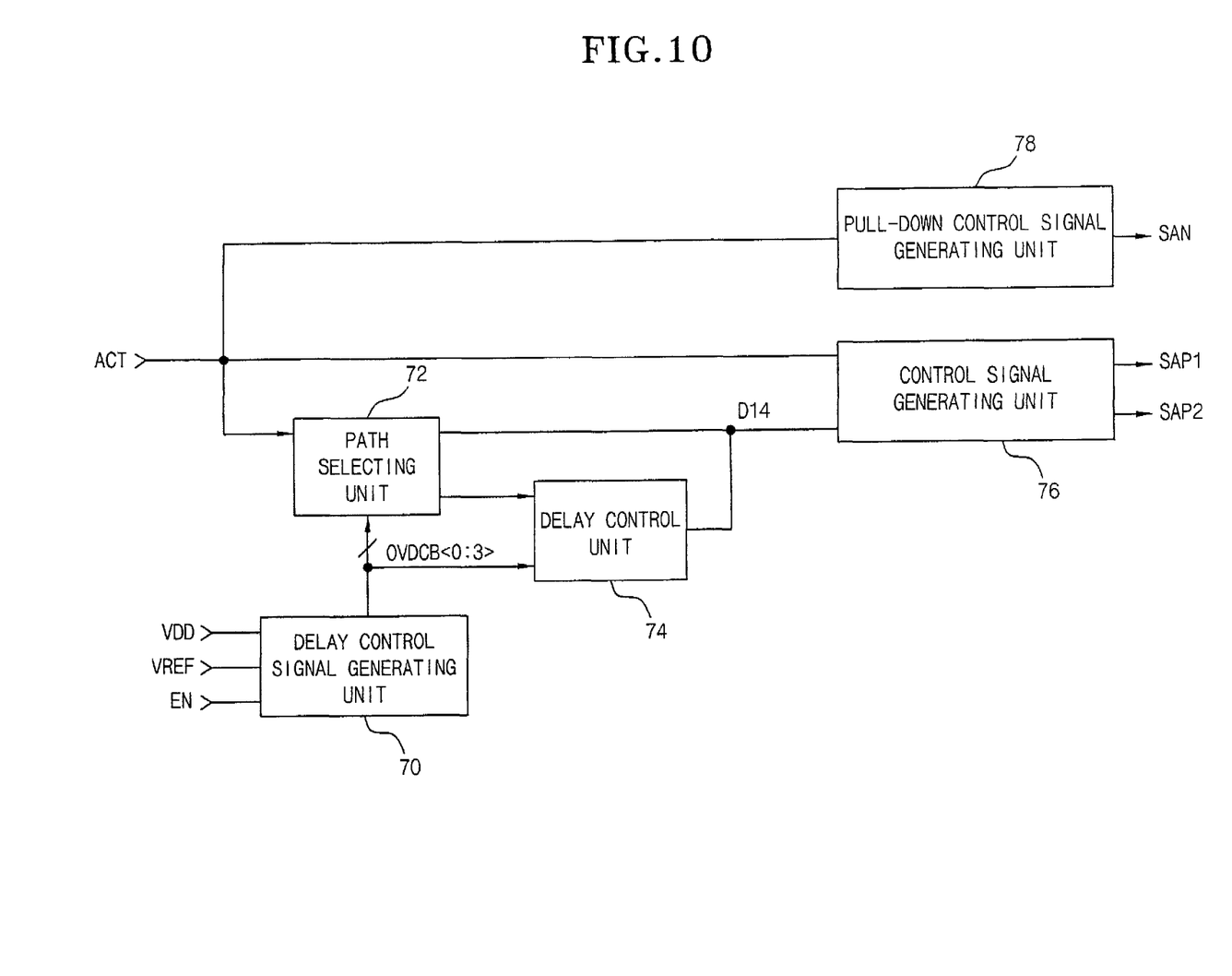
FIG. 10 is a block diagram showing a sense amplifier control circuit according to second embodiment of the present invention.

The delay control signal generating unit 70 can be structured as the voltage comparing unit of FIG. 6. The delay control signal generating unit 70 compares the reference voltage VREF with the divided voltages obtained by dividing the power supply voltage VDD by utilizing a plurality of resistors in series, and the delay control signal generating unit 70 provides the delay control signal OVDCB in accordance with the comparing results when the enable signal EN is enabled, More specifically, the delay control signal generating unit 70 disables all of the delay control signals OVDCB<0:3> at a high level to output them if the potentials of the divided voltages VD0 to VD3 are higher than that of the reference voltage VREF (column 1), and enables any one of the delay control signals OVDVB<0:3> at a low level to output it if any one of the potentials of the divided voltages VD0 to VD3 is lower than that of the reference voltage VREF (column 1).

The path select unit 72 can be structured as the path select unit 52 of FIG. 9. The path select unit 72 outputs the active signal ACT as the delay signal D14 without delaying it if the delay control signals OVDBC<0:3> are all disabled, and the select unit 72 delivers the active signal ACT to the delay control unit 74 if any one of the delay control signals OVDBC<0:3> is enabled.

The control delay unit 74 can be structured as the delay control unit 54 of FIG. 9, and the control delay unit 74 can control the delay time of the delay signal D14 by controlling the number of the delay chains that delay the active signal ACT according to the delay control signals OVDCB<0:3>

The control signal generating unit 76 can be structured as the control signal generating unit 60 of FIG. 8, and combines the active signal ACT with the delay signal D14 to generate the overdrive control signal SAP1 and the pull-up control signal SAP2.

The pull-down control signal generating unit 78 receives the active signal ACT to generate the pull-down signal SAN, which is synchronized to the overdrive control signal SAP1.

As such, the sense amplifier control circuit according to the second embodiment of the present invention can reduce unnecessary overdrive operation of the sense amplifier by providing the overdrive control signal and the pull-up control signal of which the enable pulse width is controlled in response to the power supply voltage, and thus reduce current consumption and secure operation stability of the semiconductor memory Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A sense amplifier control circuit, comprising:
a delay control signal generating unit receiving a power supply voltage and outputting delay control signals having values corresponding to each of a plurality of divided voltages obtained by dividing a potential of a power supply voltage;
a path select unit selecting a delay path of an active signal according to the delay control signals;
a delay control unit selected by the path select unit to control a delay of the active signal according to the delay control signals and outputs the active signal; and
a control signal generating unit receiving the active signal and an output from the path select unit or an output from the delay control unit as a delay signal to generate an overdrive control signal and a pull-up control signal used for driving the sense amplifier.

2. The sense amplifier control circuit as set forth in claim 1, wherein the delay control signal generating unit comprises:
a voltage dividing unit outputting the plurality of divided voltages having sequential voltage levels by dividing the potential of the power supply voltage;
a voltage comparing unit comparing each of the divided voltages with a reference voltage and outputting comparing signals;
an output signal generating unit combining the comparing signals generated by the divided voltages having sequential adjacent potential levels and outputting the delay control signals; and
an output control unit controlling outputs of the delay control signals according to an enabled signal applied from a mode register set.

3. The sense amplifier control circuit as set forth in claim 2, wherein the voltage dividing unit comprises:
a first resistor connected to the power supply voltage; and
a plurality of second resistors connected in series between the first resistor and a ground voltage,
wherein the divided voltages are sequentially output from each of the common nodes between the second resistors.

4. The sense amplifier control circuit as set forth in claim 3, wherein the first resistor has a value larger than that of each of the plurality of second resistors and each of the plurality of second resistors has the same.

5. The sense amplifier control circuit as set forth in claim 2, wherein the voltage comparing unit comprises a plurality of comparators comparing each divided voltage with the reference voltage and outputting the comparing signals.

6. The sense amplifier control circuit as set forth in claim 2, wherein the output signal generating unit combines the outputted comparing signal, with,
the inverted comparing signal obtained by inverting the comparing signal output that immediately precedes the outputted comparing signal, and
the inverted comparing signal obtained by inverting the comparing signal output that immediately follows the outputted comparing signal, and the output signal generating unit enables and outputs the delay control signal when the comparing signal and the inverted comparing signals are all enabled.

7. The sense amplifier control circuit as set forth in claim 1, wherein the path selecting unit comprises:
a NAND gate receiving the delay control signals and outputting the path select signal if any of the delay control signals is enabled;
a first path gate outputting the active signal as the delay signal when the path select signal is disabled; and
a second path gate outputting the active signal to the delay control unit when the path select signal is enabled.

8. The sense amplifier control circuit as set forth in claim 1, wherein the delay control unit comprises:
a plurality of delay chains connected in series to sequentially delay the active signal delivered from the path selecting unit; and
path gates connected in parallel with an output terminal of each of the delay chains and controlled by the delay control signals to output the delay signal from each delay chain.

9. The sense amplifier control circuit as set forth in claim 8, wherein the each delay chain comprises:
a delay cell delaying an input signal by a prescribed time and outputting the input signal;
a NAND gate inputting the input signal and an output from the delay cell; and
an inverter inverting an output from the NAND gate and outputting it.

10. The sense amplifier control circuit as set forth in claim 9, wherein the delay cell comprises a plurality of inverters connected in series.

11. The sense amplifier control circuit as set forth in claim 1, wherein the control signal generating unit comprises:
a first inverter inverting the delay signal;
a NAND gate NAND-combining an output from the first inverter with the active signal;
a second inverter inverting the active signal;
a third inverter inverting an output from the NAND gate;
a NOR gate inputting outputs from the second inverter and the third inverter;
a first inverter group outputting the output from the second inverter as the overdrive control signal; and
a second inverter group outputting the output from the NOR gate as the pull-up control signal.

12. The sense amplifier control circuit as set forth in claim 11, wherein the first inverter group and the second inverter group each comprise an even number of inverters connected in series.

* * * * *